United States Patent
Pan et al.

[11] Patent Number: 6,130,570
[45] Date of Patent: *Oct. 10, 2000

[54] MESFET CIRCUIT UTILIZING ONLY POSITIVE POWER SUPPLIES

[75] Inventors: Eric Ting-Shan Pan, Fremont, Calif.; Roger Lee Foust, Colorado Springs, Colo.

[73] Assignee: Samsung Electronics Co., Ltd., Seoul, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/932,677

[22] Filed: Sep. 18, 1997

[51] Int. Cl.[7] .................................................. H03K 17/687
[52] U.S. Cl. .................................... 327/431; 327/416
[58] Field of Search .................................... 327/415, 416, 327/430, 431, 436, 437

[56] References Cited

U.S. PATENT DOCUMENTS

| | | | |
|---|---|---|---|
| 4,810,911 | 3/1989 | Noguchi | 327/439 |
| 4,908,531 | 3/1990 | Podell et al. | 327/431 |
| 5,497,118 | 3/1996 | Ueno et al. | 327/416 |
| 5,548,239 | 8/1996 | Kohama | 327/408 |
| 5,554,892 | 9/1996 | Norimatsu | 327/431 |

*Primary Examiner*—Terry D. Cunningham
*Attorney, Agent, or Firm*—Townsend and Townsend and Crew LLP

[57] ABSTRACT

A biasing system for an FET utilizes a source biasing capacitor which is charged to a positive DC ground voltage relative to RF ground. The gate of the FET is thus biased negative to the source without requiring a negative power supply.

2 Claims, 3 Drawing Sheets

MESFET CIRCUIT UTILIZING ONLY POSITIVE POWER SUPPLIES

BACKGROUND OF THE INVENTION

1. Field of the Invention

The present invention relates generally to high-frequency semiconductor devices and more particularly relates to an improved biasing technique for a field effect transistor (FET).

2. Description of the Related Art

Monolithic Microwave Integrated Circuits (MMICs) typically utilize GaAs metal semiconductor field-effect transistors (MESFETs) as active devices. The control grid (gate) of a MESFET is biased negatively with respect to the source electrode so that a retarding potential barrier is presented to electrons flowing from the source to the drain.

FIG. 1 depicts the standard two power supply technique for biasing a MESFET 10 having source, gate, and drain terminals 12, 14, and 16, respectively. In FIG. 1, a first power supply 20 biases the drain 16 positively with respect to the source 12. A second power supply 22 biases the gate 16 negatively with respect to the source 12.

However, for many applications the need to provide the negative power supply increases the expense, complexity, and size of the device.

Negative gate bias has also been provided utilizing a charge pump by converting voltage from a positive power supply, but again the provision of a charge pump increases the complexity of the circuit.

SUMMARY OF THE INVENTION

According to one aspect of the present invention, the DC ground is separated from the RF ground by a capacitor. The "original" DC ground, normally the source terminal of an FET, is raised to a positive voltage, while the RF ground is maintained as the "true" ground. Consequently, the gate terminal is biased at a positive voltage that is less than or equal to the raised DC ground.

According to another aspect of the invention, a metal-insulator-metal (MIM) capacitor is coupled between the RF ground and the source terminal. A positive voltage charges the MIM capacitor to raise the DC ground positive with respect to the RF ground.

According to another aspect of the invention, a single-pole, double-throw switch is formed of four FET transistors and utilizes a source biasing system so that a negative control voltage is not required.

Additional advantages and features of the invention will become apparent in view of the following detailed description and appended drawings.

DETAILED DESCRIPTION OF THE PREFERRED EMBODIMENTS

A system for biasing a MESFET that does not require a negative bias to gate which can be operated by a nonnegative control voltage.

Figure 1:
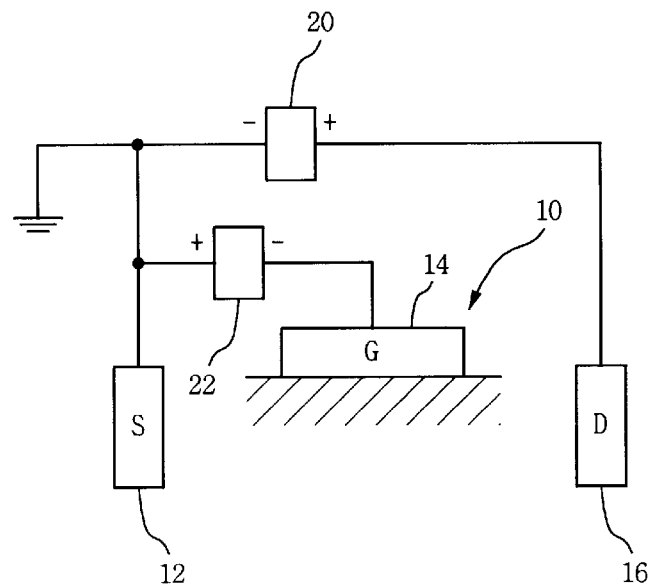
FIG. 1 is a schematic diagram of a conventional FET biasing circuit.
Figure 2:
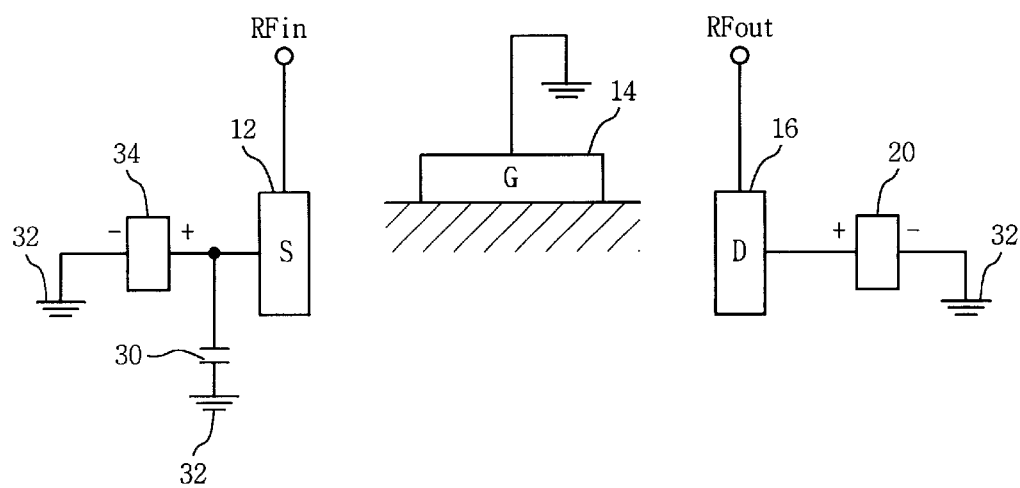
FIG. 2 is a schematic diagram of a biasing circuit not requiring a negative power supply.

FIG. 2 is a schematic diagram of a preferred embodiment. In FIG. 2 a MESFET 10 having source, gate, and drain terminals 12, 14, and 16 is depicted. A first power supply 20 biases the drain 16 positively relative to the source 12. A MIM capacitor 30 has first and second terminals, with the first terminal connected to the ground terminal 32. A biasing power supply 34 includes positive and negative terminals. The negative terminal is coupled to the RF ground terminal 32 and the positive terminal is coupled to the second terminal of the MIM capacitor 30. The second terminal of the MIM capacitor is also coupled to the source terminal 12 of the MESFET transistor. The power supply 34 may be replace by a resistor in the self-biasing technique.

The source and drain terminals 12 and 16 are coupled to RFin and RFout ports respectively. In FIG. 2 the gate terminal is grounded. Because of the positive voltage on the MIM capacitor 30, the gate voltage is negative with respect to the source voltage and the transistor is off. The RF input signal however "sees" the true ground because the MIM capacitor 30 has low impedance at RF frequencies.

The operation of the circuit depicted in FIG. 2 will now be described. The biasing power supply charges the MIM capacitor 30 to a positive biasing voltage, the "DC ground" relative to the ground terminal 32. Thus, the gate terminal can be biased to a positive voltage as long as the gate terminal is negative relative to or no larger than the raised DC ground level. Additionally, the drain terminal voltage must remain at a positive voltage that is equal to or greater than the source terminal voltage for the device to achieve performance.

As is well-known, the MIM capacitor 30 is seen as a short circuit by the RF signal so that the RF signal sees the "true" RF ground. As long as the voltage swing of the RF signal is less that the magnitude of the positive biasing voltage generated by the gate 14 remains negative relative to the source 12.

Figure 3:
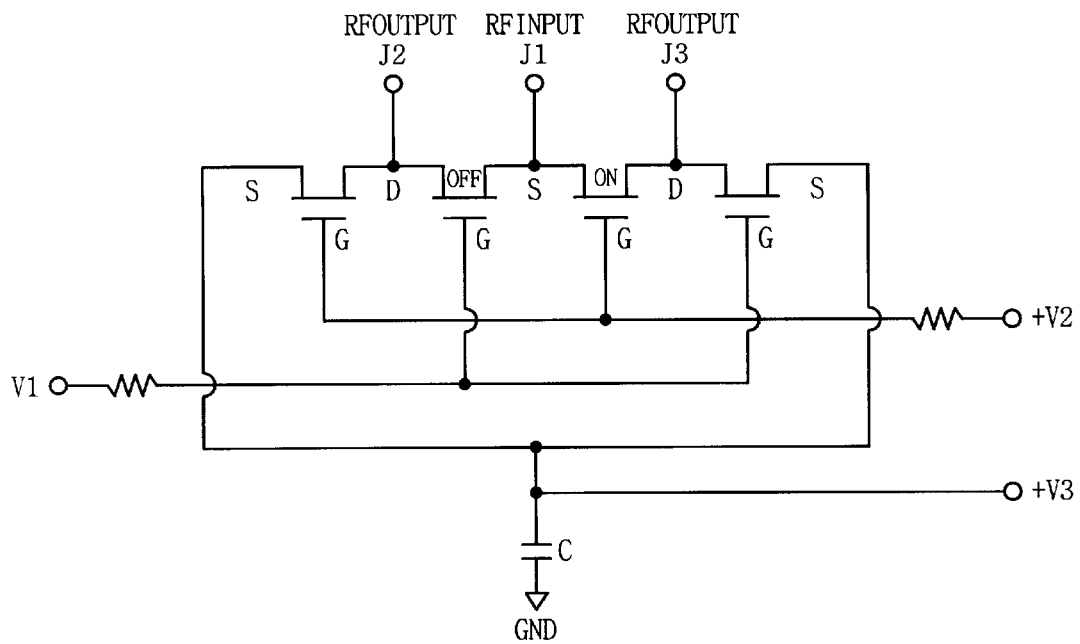
FIG. 3 is a circuit diagram illustrating the concepts of the present invention.

FIG. 3 is a circuit diagram of a +3V SPDT switch utilizing the concepts of the invention. Four MESFETs 10A–10D are connected in series where the first and second MESFETs 10A and 10B share a first common source/drain terminal 40 coupled to a first RF output port J2, the second and third MESFETs 10B and 10C share a second common source/drain terminal 42 coupled to an RF input port J1, and third and fourth MESFETs 10C and 10D share a third common source/drain terminal 44 coupled to a second RF output port J3.

The source terminals of the first and fourth MESFETs 10A and 10D are coupled to a first terminal of the MIM capacitor 30 which, in the preferred embodiment is charged to +3 v by V₃. The second terminal of the capacitor 30 is grounded. The source/drain terminals of all the MESFETs 10A–10C are biased to the DC ground of +3 v.

The gates of the second and fourth MESFETs 10B and 10D are coupled to a first power supply terminal V1 and the gates of the first and third MESFETs 10A and 10C are coupled to a second power supply terminal V2 where V1 and V2 are switched between 0 v and +3 v.

The operation of the SPDT switch depicted in FIG. 3 will now described. If it is desired to couple the second RF output port J3 to the RF input port J1 then V2 is switched to +3 v and V1 is switched to 0 v. The gate of the third MESFET 10C is positive so that MESFET is turned on to couple J1 to J3. Additionally, the gate of the first MESFET 10A is positive so that MESFET is turned on to shunt the RF signal on J2 to ground. Because the MIM capacitor 30 has very low impedance at RF frequencies, the RF signals "see" the true ground. Additionally, because the DC ground is at +3 v, the gates of the second and fourth MESFETs 10B and 10C are negative relative to the source/drain terminals so those transistors are off to isolate J2 from J1.

The SPDT switch of FIG. 3 therefor segregates the DC and RF grounds and biases the DC ground to +3 v. The control voltages toggle between 0 v (Vlow) and +3 v (Vhigh). No negative power supply is required to bias the gates to turn off the transistors.

Figure 4A:
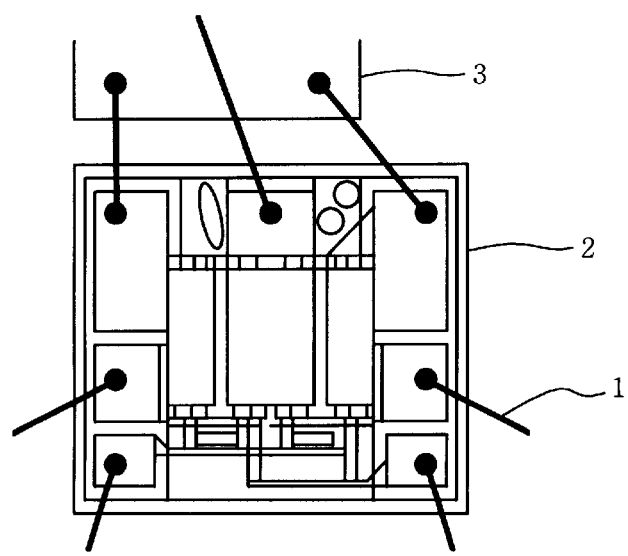
FIGS. 4A and 4B are schematic diagrams of interconnection's for an MMIC SPDT switch of utilizing concepts of the invention.
Figure 4B:
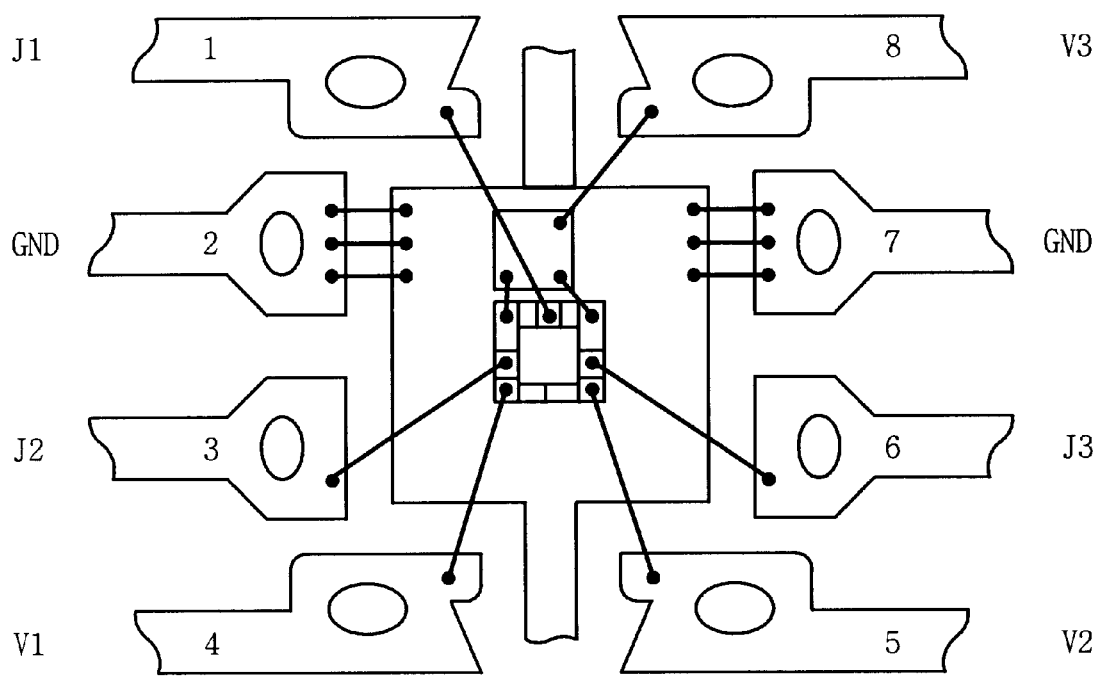

FIGS. 4A and B depict the connections to the SPDT switch of FIG. 3 embodied as an MMIC 50. Note in FIG. 4B that the MIM capacitor 32 is mounted on the chip holder which is bonded to the back of the MMIC 50. The ground connections from pads 2 and 7 are made to the chip holder in the standard manner. However, the source contacts are coupled to the MIM capacitor 32 which is charged to the DC ground by through pad 8.

The invention has now been described with reference to the preferred embodiments. Alternatives and substitutions will now be apparent to persons of skill in the art. For example, the SPDT switch implemented utilizing different circuits than as depicted in FIG. 3 can use the DC voltage shifting technique of the invention. Accordingly, it is not intended to limit the invention except as provided by the appended claims.

What is claimed is:

1. A method of switching between first and second RF outputs in a SPDT switch, said SPDT switch implemented in a monolithic microwave integrated circuit, with said SPDT switch including a plurality of MESFETs having common source/drain terminals, and with said first and second RF outputs and an RF input coupled to selected source/drain terminals, said SPDT switch having a bias capacitor having a first terminal coupled to ground and with a second terminal coupled to bias selected source terminals of said MESFETs, said SPDT switch further comprising first and second select inputs coupled to respective selected gate terminals of said MESFETs, said method comprising:

biasing the second terminal of the bias capacitor with a first voltage, said first voltage having a non-negative value with respect to ground;

biasing the first select input with a second voltage and the second select input with a third voltage, so that said SPDT switch switches the RF input to the first RF output; and biasing the second select input with said second voltage and the first select input with said third voltage, so that said SPDT switch switches the RF input to the second RF output, wherein said second voltage is greater than said first voltage and said third voltage is less than said first voltage and wherein the first, second and third voltages have non-negative values with respect to ground.

2. The method of claim 1 further comprising the step of setting said first voltage, said second voltage and said third voltage to values in the range of 0.0 to +3 volts.

* * * * *